(12) United States Patent
Matsuda et al.

(10) Patent No.: US 9,160,300 B2
(45) Date of Patent: Oct. 13, 2015

(54) ACOUSTIC WAVE DEVICE

(75) Inventors: Satoru Matsuda, Tokyo (JP); Takashi Matsuda, Tokyo (JP); Michio Miura, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 360 days.

(21) Appl. No.: 13/610,384

(22) Filed: Sep. 11, 2012

(65) Prior Publication Data

US 2013/0093537 A1 Apr. 18, 2013

(30) Foreign Application Priority Data

Oct. 12, 2011 (JP) .................... 2011-225108

(51) Int. Cl.
*H03H 9/64* (2006.01)
*H03H 9/02* (2006.01)

(52) U.S. Cl.
CPC ......... *H03H 9/02834* (2013.01); *H03H 9/0222* (2013.01); *H03H 9/02559* (2013.01); *H03H 9/02842* (2013.01); *H03H 9/64* (2013.01)

(58) Field of Classification Search
CPC . H03H 9/6483; H03H 9/02842; H03H 9/059; H03H 9/02574; H03H 9/0222

USPC ................ 333/193, 196; 310/313 R
See application file for complete search history.

(56) References Cited

U.S. PATENT DOCUMENTS

| 7,741,931 B2 * | 6/2010 | Matsuda et al. .............. 333/133 |
| 2008/0111237 A1* | 5/2008 | Leavy et al. .................. 257/741 |
| 2010/0164646 A1* | 7/2010 | Nakanishi et al. ............ 333/133 |

FOREIGN PATENT DOCUMENTS

| JP | 11-6901 A | 1/1999 |
| JP | 2005-260296 A | 9/2005 |

* cited by examiner

*Primary Examiner* — Benny Lee
*Assistant Examiner* — Erfan Faneian
(74) *Attorney, Agent, or Firm* — Chen Yoshimura LLP (57) ABSTRACT

An acoustic wave device includes: an electrode that is located on a substrate and excites an acoustic wave; and an oxide silicon film that is doped with an element and provided so as to cover the electrode, wherein a normalized reflectance obtained by normalizing a local maximum value of a reflectance when a light is caused to enter an upper surface of the oxide silicon film doped with the element by a reflectance when a light having a wavelength at the local maximum value is caused to enter an upper surface of the substrate directly is equal to or larger than 0.96.

7 Claims, 10 Drawing Sheets

ACOUSTIC WAVE DEVICE

CROSS-REFERENCE TO RELATED APPLICATION

This application is based upon and claims the benefit of priority of the prior Japanese Patent Application No. 2011-225108, filed on Oct. 12, 2011, the entire contents of which are incorporated herein by reference.

FIELD

A certain aspect of the present invention relates to an acoustic wave device.

BACKGROUND

A surface acoustic wave (SAW: Surface Acoustic Wave) device has been known as one of acoustic wave devices using acoustic waves. As a SAW device is small and light, and is able to obtain high attenuation, it is used in a variety of circuits that process radio signals in a frequency band of 45 MHz to 2 GHz in wireless devices such as mobile phone terminals. A variety of circuits include a transmission bandpass filter, a reception bandpass filter, a local filter, an antenna duplexer, an IF filter and an FM modulator, for example.

In recent years, with the development of high-performance and compact mobile phone terminals, it is demanded to improve frequency temperature characteristics and reduce the device size. To improve frequency temperature characteristics, there has been developed a technique that provides an oxide silicon film so as to cover a comb-shaped electrode formed on a piezoelectric substrate for example. In addition, it has been known that the optical absorption is increased when the value of X of $SiO_x$ is reduced in an oxide silicon, as disclosed in Japanese Patent Application Publication No. 11-6901 for example.

Frequency temperature characteristics may be improved by providing an oxide silicon film doped with an element so as to cover a comb-shaped electrode. This may cause a increase of the propagation loss of acoustic waves.

SUMMARY OF THE INVENTION

According to an aspect of the present invention, there is provided an acoustic wave device including: an electrode that is located on a substrate and excites an acoustic wave; and an oxide silicon film that is doped with an element and provided so as to cover the electrode, wherein a normalized reflectance obtained by normalizing a local maximum value of a reflectance when a light is caused to enter an upper surface of the oxide silicon film doped with the element by a reflectance when a light having a wavelength at the local maximum value is caused to enter an upper surface of the substrate directly is equal to or larger than 0.96.

DETAILED DESCRIPTION

Figure 1:
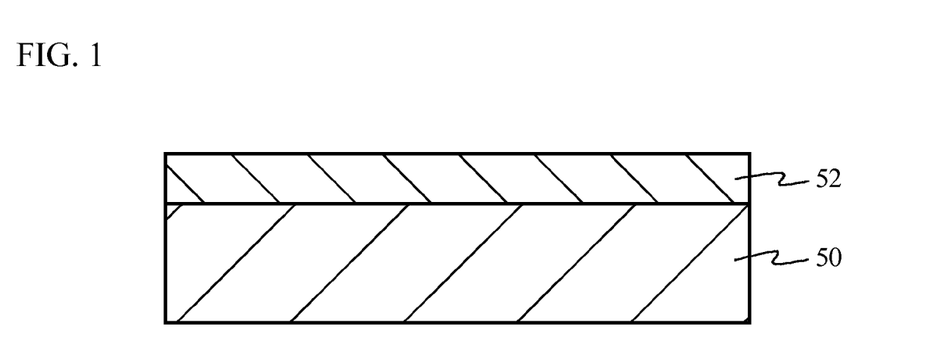
FIG. 1 is a schematic cross-sectional view of a sample used in an experiment.

A description will be given of an experiment executed by the inventors first. FIG. 1 is a schematic cross-sectional view of a sample used in the experiment. Referring to FIG. 1, a thin film 52 is located on a silicon substrate 50. Here, a sample 1 and a sample 2 are prepared. The sample 1 uses an undoped oxide silicon film (hereinafter, referred to as an $SiO_2$ film) as the thin film 52, and the sample 2 uses an oxide silicon film doped with F (fluorine) (hereinafter, referred to as an SiOF film) as the thin film 52. In the sample 1 and the sample 2, the film thickness of the thin film 52 is within a range of 1 to 3 µm. The spectroscopic film thickness meter is used to measure the $SiO_2$ film, which is the thin film 52 of the sample 1, and the SiOF film, which is the thin film 52 of the sample 2. The spectroscopic film thickness meter is widely used in measurements of a film thickness, and obtains an optical film thickness from a reflectance obtained by an optical system using a spectrophotometer.

Figure 2A:
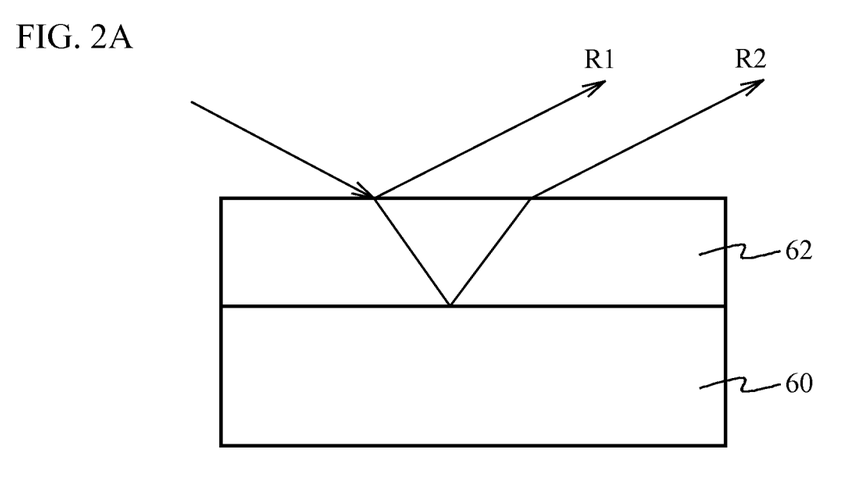
FIG. 2A through FIG. 2D are diagrams explaining a measurement principle of a spectroscopic film thickness meter.
Figure 2B:
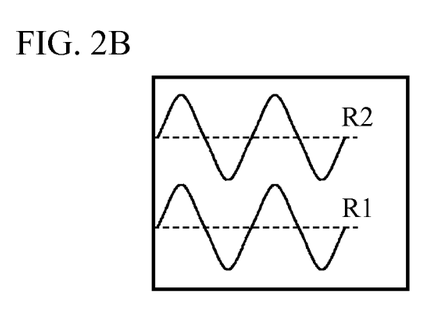
Figure 2C:
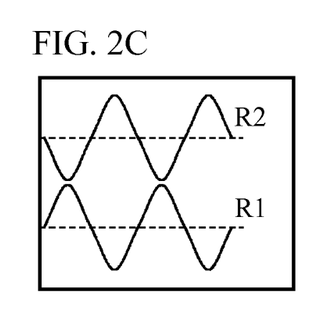
Figure 2D:
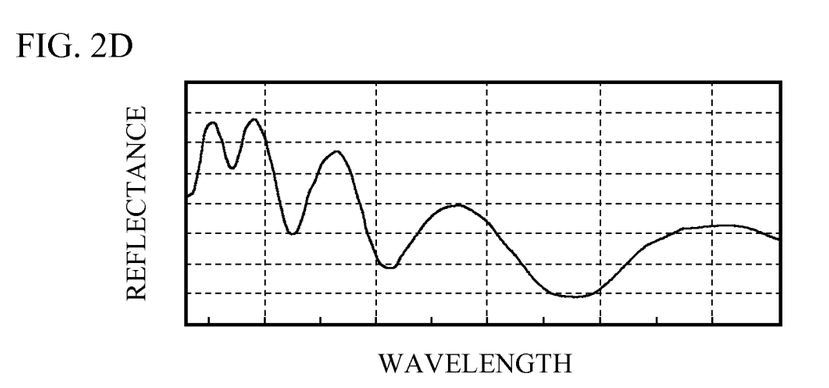

Here, a description will be given of a measurement principle of the spectroscopic film thickness meter simply with reference to FIG. 2A through FIG. 2D. Referring to FIG. 2A, a thin film 62 is located on a substrate 60. When the light is caused to enter the thin film 62 from the obliquely upper position, generated are a reflected light R1 that is reflected by the upper surface of the thin film 62 and a reflected light R2 that is reflected by a boundary face between the thin film 62 and the substrate 60. The spectroscopic film thickness meter measures the interference phenomenon between the reflected light R1 and the reflected light R2. That is to say, as illustrated in FIG. 2B, when the optical path difference between the reflected light R1 and the reflected light R2 is 0, reflected lights strengthen each other. On the other hand, as illustrated in FIG. 2C, when the optical path difference is λ/2, reflected lights weaken each other where λ represents the wavelength of the incident light. Therefore, when the reflectance of the thin film 62 is measured by changing the wavelength of the incident light by the spectrometer, the reflectance spectrum illustrated in FIG. 2D is obtained for example.

Figure 3A:
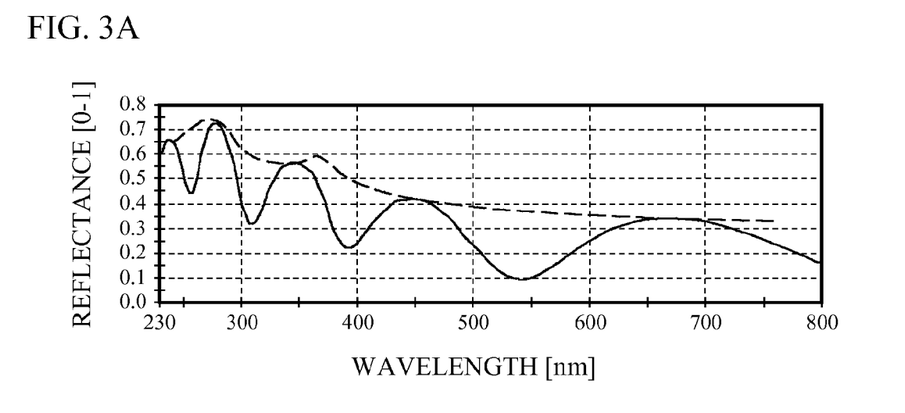
FIG. 3A indicates measurement results of a sample 1, and FIG. 3B indicates measurement results of a sample 2.
Figure 3B:
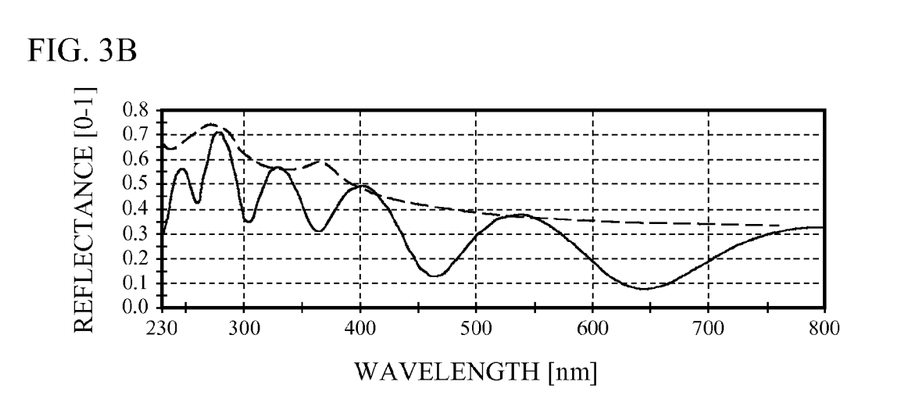

The reflectance of the thin film 52 of the sample 1 and the sample 2 is measured by using such a spectroscopic film thickness meter. FIG. 3A indicates measurement results of the sample 1, and FIG. 3B indicates measurement results of the sample 2. In FIG. 3A and FIG. 3B, a solid line indicates the reflectance spectrum when the light is caused to enter the thin film 52 from the obliquely upper position. In addition, a dashed line indicates the reflectance spectrum when the light is caused to enter the silicon substrate 50, on which the film thickness of the thin film 52 is made to be 0, directly from the obliquely upper position. That is to say, the dashed line denotes the reflectance from the silicon substrate 50. The reflectance for a wavelength equal to or smaller than 230 nm is not illustrated because of the measurement limit of the spectroscopic film thickness meter used for the experiment. Referring to FIG. 3A, when the thin film 52 is the $SiO_2$ film, the reflectance nearly coincides with the reflectance from the silicon substrate 50 at each local maximum of the reflectance. On the other hand, referring to FIG. 3B, when the thin film 52 is the SiOF film, the reflectance is smaller than the reflectance from the silicon substrate 50 even at each local maximum in short wavelengths, which may be 230 nm to 250 nm. As the wavelength becomes smaller, the reflectance at the local maximums becomes smaller than the reflectance from the silicon substrate 50. Although FIG. 3A and FIG. 3B depict measurement results in a case where the film thickness of the thin film 52 is 1 to 3 μm, the same results are obtained in a case of other film thicknesses.

When the incident light is not absorbed by the thin film 52, the reflectance of the thin film 52 becomes nearly 100% against the reflectance from the silicon substrate 50, and the local maximum value of the reflectance coincides with the reflectance from the silicon substrate 50. Accordingly, in the sample 2 described in FIG. 3B, it turns out that the thin film 52 that is the SiOF film absorbs the light having a short wavelength such as 230 nm to 250 nm. It is considered that such an absorption of light is caused because a part of F with which $SiO_2$ is doped is not substituted into Si—O bonds and exists as an impurity, and the strain of the crystal structure or the oxygen defects occur.

Therefore, the absorption of light caused by the strain of the crystal structure or the oxygen defects is not limited to the SiOF film in which a part of the element with which $SiO_2$ is doped is not substituted into Si—O bonds. For example, the absorption of light occurs also in the oxide silicon film doped with at least one of Cl (chlorine), C (carbon), N (nitrogen), P (phosphorus) and S (sulfur). When $SiO_2$ is doped with above described elements, the oxygen of Si—O bonds is replaced with the element to a certain dopant amount, but when the dopant amount becomes large, the element that is unable to displace the oxygen appears. That is to say, when the dopant amount is smaller than a threshold value, as the element is substituted into Si—O bonds, the strain of the crystal structure and the oxygen defects are suppressed, and the absorption of light rarely occurs. However, when the dopant amount exceeds the threshold value, as the element that is unable to be substituted into Si—O bonds appears, the strain of the crystal structure or the oxygen defects occur, and the absorption of light increases. Accordingly, it is considered that when the strain of the crystal structure or the oxygen defects occurs in the oxide silicon film doped with an element (hereinafter, referred to as a doped oxide silicon film), the absorption of light occurs, and the reflectance decreases.

Figure 4:
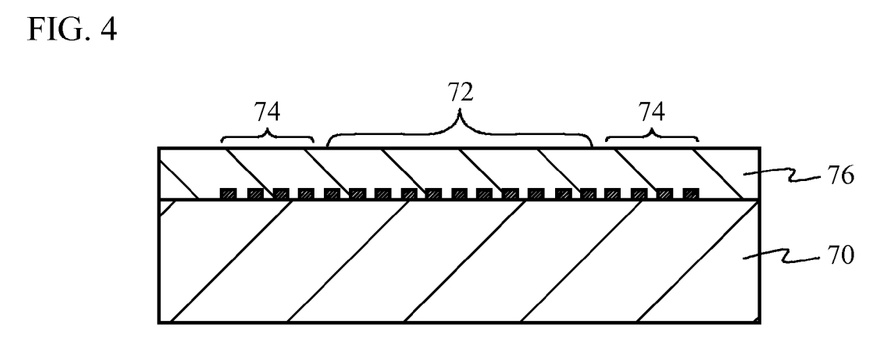
FIG. 4 is a schematic cross-sectional view of a resonator made for examining a correlation between a reflectance and a propagation loss.

Thus, the inventors conducted the study about a correlation between the reflectance of a medium and a propagation loss of an acoustic wave in a resonator in which the medium is provided so as to cover a comb-shaped electrode. FIG. 4 is a schematic cross-sectional view of a resonator made for examining the correlation between the reflectance and the propagation loss. Referring to FIG. 4, a comb-shaped electrode 72 and reflectors 74 are located on a piezoelectric substrate 70 made of a lithium tantalate (LT) substrate. The comb-shaped electrode 72 and the reflectors 74 are mainly made of Cu (copper). An oxide silicon film doped with F (hereinafter, referred to as an SiOF film 76) is located so as to cover the comb-shaped electrode 72 and the reflectors 74 in order to improve frequency temperature characteristics. The SiOF film 76 is formed by CVD (Chemical Vapor Deposition), and has a film thickness of 0.3λ. λ is a wavelength of an acoustic wave, and corresponds to a period of electrode fingers of the comb-shaped electrode 72.

Here, resonators are made by forming the SiOF film 76 under various film forming conditions. A temperature, a pressure, a material gas, a flow rate of material gas, and a high-frequency output (high frequency power to generate plasma) are changed when the film is formed. It is possible to change, for example, the dopant amount of F in the SiOF film 76 by changing the film forming condition. The reflectance spectrum is measured with the spectroscopic film thickness meter by causing the light to enter the SiOF film 76 from the obliquely upper position with respect to each of these resonators. In addition, the reflectance spectrum is measured by causing the light to enter the upper surface of the piezoelectric substrate 70 directly from the obliquely upper position. Then, obtained is a normalized reflectance calculated by normalizing the local maximum value of the reflectance of the SiOF film 76 when the wavelength of the incident light is around 240 nm by the reflectance from the piezoelectric substrate 70 at the wavelength in the local maximum value. The reason why the normalized reflectance when the wavelength of the incident light is around 240 nm is obtained is because as the wavelength of the light becomes shorter, the absorption of light occurs and the reflectance decreases as described in FIG. 3B. In addition, the Q-value of the anti-resonance frequency is measured with respect to each of resonators. In addition, a resonator using the $SiO_2$ film having a film thickness of 0.3λ (X is the wavelength of the acoustic wave) instead of the SiOF film 76 is made, and the Q-value of the anti-resonance frequency of this resonator is also measured. Then, obtained is a normalized Q-value calculated by normalizing the Q-value of the anti-resonance frequency of the resonator using the SiOF film 76 by the Q-value of the anti-resonance frequency of the resonator using the $SiO_2$ film.

Figure 5:
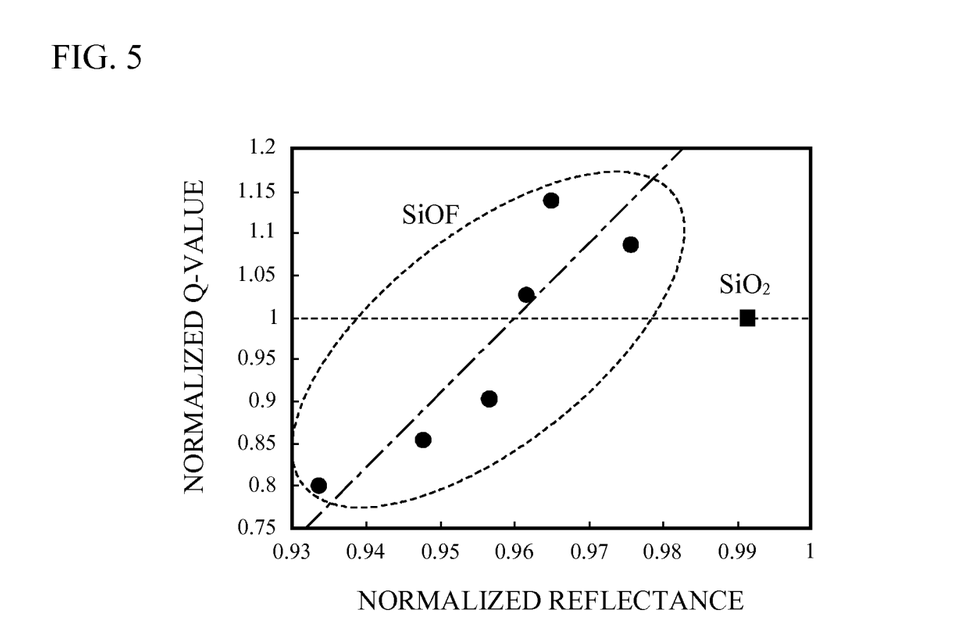
FIG. 5 is a diagram illustrating a normalized Q-value against a normalized reflectance.

FIG. 5 depicts the normalized Q-value against the normalized reflectance. In FIG. 5, a chain line indicates the approximated line of measurement results in the resonator using the SiOF film 76. Referring to FIG. 5, the normalized reflectance correlates with the normalized Q-value. When the normalized reflectance becomes smaller than 0.96, the normalized Q-value becomes smaller than 1, and the propagation loss of the acoustic wave increases. The reason why the normalized Q-value becomes small when the normalized reflectance decreases as described above is considered as follows. When the dopant amount of F in the SiOF film 76 exceeds the threshold value, as described above, the strain of the crystal structure, the oxygen defects or the like occurs due to F that is unable to be substituted into Si—O bonds, and then the absorption of light increases, and the reflectance decreases. In addition, when the strain of the crystal structure, the oxygen defects, or the like occurs in the SiOF film 76, the propagated acoustic wave decays due to the strain of the crystal structure, the oxygen defects or the like. Therefore, it is considered that when the normalized reflectance becomes small, the propagation loss of the acoustic wave becomes large, and the normalized Q-value decreases. When the dopant amount of F is smaller than the threshold value, as F displaces the oxygen of Si—O bonds, the strain of the crystal structure, the oxygen defects or the like is suppressed. Thus, it is considered that when the normalized reflectance is larger than 0.96, the dopant amount of F is a dopant amount with which the strain of the crystal structure, the oxygen defects or the like is suppressed, and the decrease in the normalized Q-value is suppressed.

As described above, in the doped oxide silicon film, when the dopant amount becomes large, the strain of the crystal structure, the oxygen defects or the like easily occurs, and the reflectance becomes small. Thus, when the normalized reflectance becomes small, the propagation loss of the acoustic wave increases and the normalized Q-value decreases in the resonator having the doped oxide silicon film covering the comb-shaped electrode. Therefore, the result of FIG. 5 can be also applied to resonators using a doped oxide silicon film. In addition, although FIG. 5 indicates the measurement result of the SiOF film 76 with a film thickness of 0.3λ, the result of FIG. 5 can be applied to a resonator using a doped oxide silicon film with a film thickness of other than 0.3λ. For example, the result of FIG. 5 can be applied to a resonator using a doped oxide silicon film with a film thickness within a range of thickness generally used for improving frequency temperature characteristics.

Now a description will be given of embodiments based on the knowledge obtained by above-described experiments and capable of improving frequency temperature characteristics and reducing the propagation loss of the acoustic wave.

First Embodiment

Figure 6A:
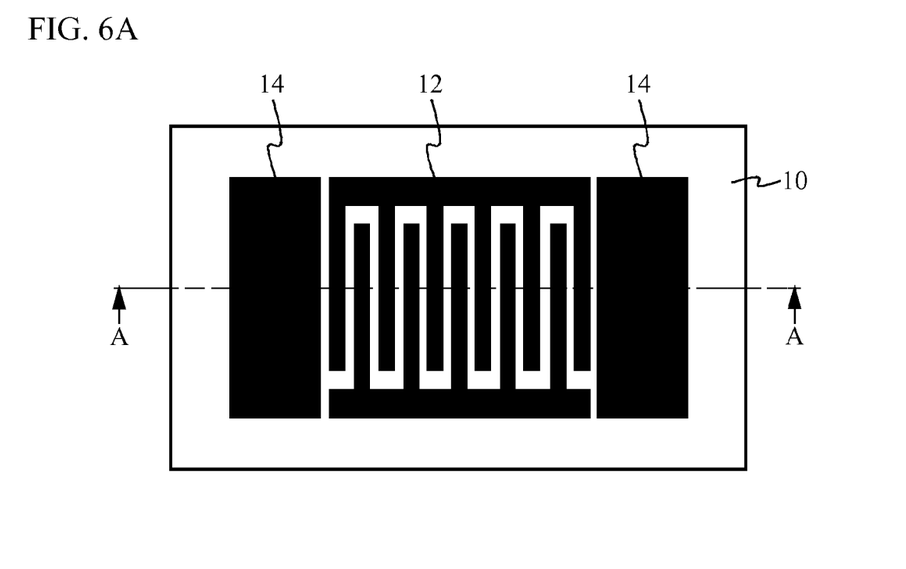
FIG. 6A is a top schematic view of an acoustic wave device in accordance with a first embodiment.
Figure 6B:
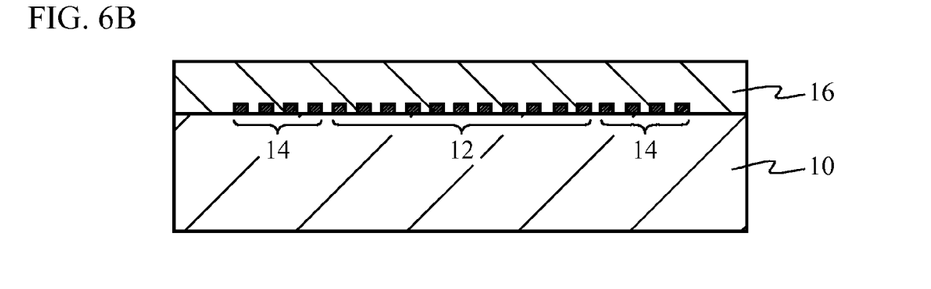
FIG. 6B is a schematic cross-sectional view taken along line A-A in FIG. 6A.

FIG. 6A is a top schematic view of an acoustic wave device in accordance with a first embodiment, and FIG. 6B is a schematic cross-sectional view taken along line A-A in FIG. 6A. In FIG. 6A, the SiOF film is illustrated transparently. Referring to FIG. 6A, a comb-shaped electrode 12 and reflectors 14 are located on a piezoelectric substrate 10 made of, for example, an LT substrate. The reflectors 14 are located at both sides of the comb-shaped electrode 12. The comb-shaped electrode 12 is an electrode that excites an acoustic wave. The comb-shaped electrode 12 includes an input electrode and an output electrode disposed so as to face each other, and electrode fingers of the input electrode and those of the output electrode are aligned in alternate order. The comb-shaped electrode 12 and the reflectors 14 are mainly made of Cu for example.

Referring to FIG. 6B, an oxide silicon film doped with, for example, F (hereinafter, referred to as an SiOF film 16) is provided so as to cover the comb-shaped electrode 12 and the reflectors 14 located on the piezoelectric substrate 10. The film thickness of the SiOF film 16 is larger than that of the comb-shaped electrode 12. For example, the film thickness of the SiOF film 16 between electrode fingers is larger than that of the comb-shaped electrode 12. In addition, the SiOF film 16 is formed by adjusting the film forming condition in CVD so that equal to or larger than 0.96 becomes a normalized reflectance, which is obtained by normalizing the local maximum value of the reflectance when the light is caused to enter the upper surface of the SiOF film 16 by the reflectance when the light having a wavelength at the local maximum value is caused to enter the upper surface of the piezoelectric substrate 10 directly. For example, the SiOF film 16 is formed by using $SiH_4$, $N_2O$, and $C_2F_6$ as material gas, making a flow rate ratio $SiH_4:N_2O:C_2F_6=1:50:3$, and making a film formation temperature 270° C.

As described above, the first embodiment provides the SiOF film 16 so as to cover the comb-shaped electrode 12 located on the piezoelectric substrate 10. Therefore, it is possible to improve frequency temperature characteristics. In addition, the normalized reflectance of the SiOF film 16 is made to be equal to or larger than 0.96. Accordingly, as described in FIG. 5, it is possible to reduce the propagation loss of the acoustic wave. Therefore, the acoustic wave device of the first embodiment is able to improve frequency temperature characteristics and to reduce the propagation loss of the acoustic wave.

The first embodiment provides the SiOF film 16 (oxide silicon film doped with F) so as to cover the comb-shaped electrode 12, but is not intended to suggest any limitations, and it is sufficient if the doped oxide silicon film is provided. It is preferable that the doped oxide silicon film is formed by doping the oxide silicon film with an element that displaces the oxygen of Si—O bonds in terms of improving frequency temperature characteristics. For example, it is preferable that the oxide silicon film is doped with at least one of F, Cl, C, N, P and S. Even in a case where the doped oxide silicon film is provided, it is possible to improve frequency temperature characteristics and to reduce the propagation loss of the acoustic wave by making the normalized reflectance of the doped oxide silicon film equal to or larger than 0.96. In addition, it is preferable that the normalized reflectance of the doped oxide silicon film is made to be equal to or larger than 0.965, more preferably 0.97. This enables to reduce the propagation loss of the acoustic wave more reliably. Moreover, the oxide silicon film may be doped with more than one kind of element in addition to a single kind of element.

FIG. 5 depicts the normalized reflectance obtained by normalizing the local maximum value of the reflectance when the wavelength of the incident light is around 240 nm, but is not intended to suggest any limitation. As described in FIG. 3B, when the wavelength of the incident light is a short wavelength such as 230 nm to 250 nm, the absorption of light easily occurs in the doped oxide silicon film, and the normalized reflectance tends to become small. Thus, it is preferable that equal to or larger than 0.96 is a normalized reflectance obtained by normalizing the local maximum value of the reflectance when the wavelength of the incident light is within a range of 230 nm to 250 nm. In addition, when the measurement limit of the spectroscopic film thickness meter is equal to or smaller than 230 nm, it is preferable that equal to or larger than 0.96 is a normalized reflectance obtained by normalizing the local maximum value of the reflectance when the wavelength of the incident light is within a range between the measurement limit value of the spectroscopic film thickness meter and 250 nm.

In the first embodiment, a description was given of a case where the piezoelectric substrate 10 is an LT substrate, but the result of FIG. 5 can be applied to a lithium niobate (LN) substrate. This is because the refractive index is not largely different.

The first embodiment is not limited to the resonator, but may be applied to a ladder-type filter using the resonator or a multimode filter. In addition, the comb-shaped electrode may be a single layer mainly including one of Al, Au, Ag, Cu, W, Ta, Pt, Mo, Ni, Co, Cr, Fe, Mn and Ti, or a multilayer of these.

The first embodiment uses $SiH_4$, $N_2O$ and $C_2F_6$ as material gas in forming the SiOF film 16, but is not intended to suggest any limitation. For example, in addition to $SiH_4$, tetraethoxysilane (TEOS) or $SiF_4$ may be used as an Si source, and in addition to $C_2F_6$, at least one of $CF_4$, $NF_3$, $F_2$, HF, $SF_6$, $ClF_3$, $BF_3$, $BrF_3$, $SF_4$, $SiF_4$, $NF_2Cl$, $FSiH_2$ and $F_3SiH$ may be used as an F source.

Second Embodiment

Figure 7:
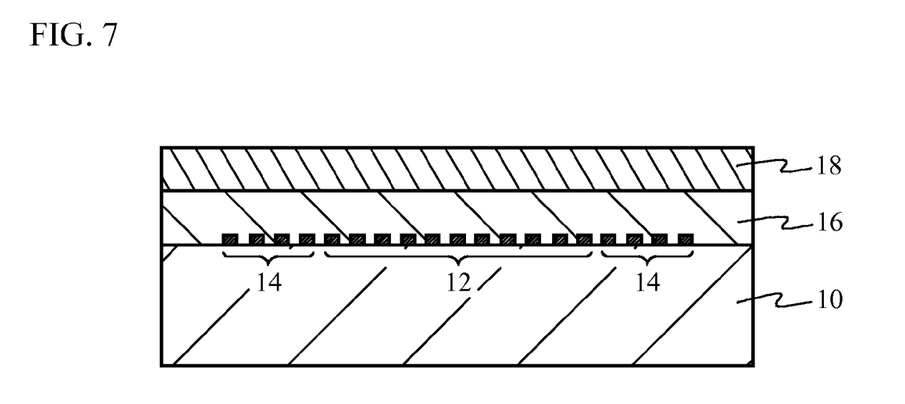
FIG. 7 is a schematic cross-sectional view of an acoustic wave device in accordance with a second embodiment.

FIG. 7 is a schematic cross-sectional view of an acoustic wave device in accordance with a second embodiment. Referring to FIG. 7, a dielectric substance 18 made of, for example, an aluminum oxide film is located on the SiOF film 16. As other structures are the same as those of the first embodiment, a description is omitted.

The acoustic velocity of the aluminum oxide film is faster than that of the SiOF film. Thus, the acoustic wave energy is confined between the dielectric substance 18 and the surface of the piezoelectric substrate 10. That is to say, the acoustic wave device in accordance with the second embodiment is a boundary acoustic wave device. Therefore, the acoustic wave device of the second embodiment is able to reduce the size of the device.

As described in the second embodiment, even in a case where the dielectric substance of which the acoustic velocity is faster than that of the doped oxide silicon film is located on the doped oxide silicon film, it is possible to improve frequency temperature characteristics and reduce the propagation loss of the acoustic wave by making the normalized reflectance of the doped oxide silicon film equal to or larger than 0.96.

The dielectric substance 18 is not limited to the aluminum oxide film, and it is sufficient if the acoustic velocity of the dielectric substance is faster than that of the doped oxide silicon film. For example, the dielectric substance 18 may be a silicon nitride film or a silicon oxynitride (SiON) film besides the aluminum oxide film.

It is possible to measure the reflectance of the doped oxide silicon film after removing the dielectric substance on the doped oxide silicon film by etching in the boundary acoustic wave device described in the second embodiment. At this time, even though the doped oxide silicon film is etched a little because of the overetching, this rarely affects on the measurement result of the reflectance. Moreover, the reflectance of the doped oxide silicon film may be obtained by obtaining the reflectance of the dielectric substance located on the doped oxide silicon film in advance and referring to the reflectance of the dielectric substance that has been obtained in advance after measuring the reflectance in a state of a multilayered film of the doped oxide silicon film and the dielectric substance.

Third Embodiment

A third embodiment is a fabrication method of an acoustic wave device. Before a description is given of the fabrication method of the acoustic wave device, a description will be given of an experiment conducted by inventors. An SiOF film having a film thickness within a range of 1 to 3 μm is formed on a silicon substrate under various film forming conditions by CVD, and the reflectance spectrum of the SiOF film is measured by the spectroscopic film thickness meter. In addition, the reflectance spectrum of the silicon substrate on which the SiOF film is not located is also measured. Then, obtained is a normalized reflectance calculated by normalizing the local maximum value of the reflectance of the SiOF film when the wavelength of the incident light is around 240 nm by the reflectance from the silicon substrate. Then, resonators having a comb-shaped electrode and a reflector on a piezoelectric substrate and the SiOF film having a film thickness of 0.3λ (λ is a wavelength of an acoustic wave) formed so as to cover the comb-shaped electrode and the reflector are made. An LN substrate is used to the piezoelectric substrate and the comb-shaped electrode and the reflector are mainly made of Cu. In addition, the formation of the SiOF film is conducted by using various film forming conditions under which the SiOF film is formed on the above described silicon substrate. The Q-value of the anti-resonance frequency is measured with respect to each of these resonators. In addition, a resonator using an $SiO_2$ film having a film thickness of 0.3λ (λ is a wavelength of an acoustic wave) instead of the SiOF film is made, and the Q-value of the anti-resonance frequency is measured. Then, obtained is a normalized Q-value that is calculated by normalizing the Q-value of the anti-resonance frequency of the resonator using the SiOF film by the Q-value of the anti-resonance frequency of the resonator using the $SiO_2$ film.

Figure 8:
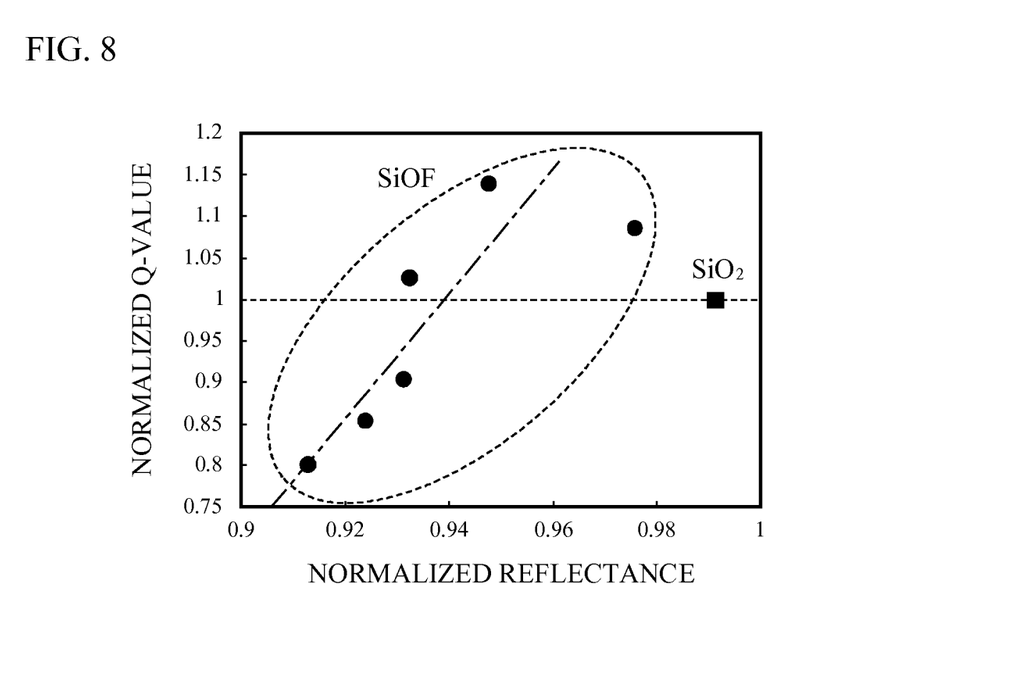
FIG. 8 is a diagram illustrating a normalized Q-value against a normalized reflectance.

FIG. 8 is a diagram depicting the normalized Q-value against the normalized reflectance. In FIG. 8, a chain line indicates the approximated line of measurement results of the resonator using the SiOF film. Referring to FIG. 8, the normalized reflectance correlates with the normalized Q-value, and when the normalized reflectance becomes smaller than 0.94, the normalized Q-value becomes smaller than 1, and the propagation loss of the acoustic wave increases. As with the reason described in the explanation of FIG. 5, the propagation loss of the acoustic wave increases and the normalized Q-value decreases when the normalized reflectance becomes small. Thus, the result of FIG. 8 can be applied to even a resonator using a doped oxide silicon film. In addition, the result of FIG. 8 can be applied to even a resonator using a doped oxide silicon film with a film thickness different from that of the sample used in the experiment of FIG. 8.

Figure 9:
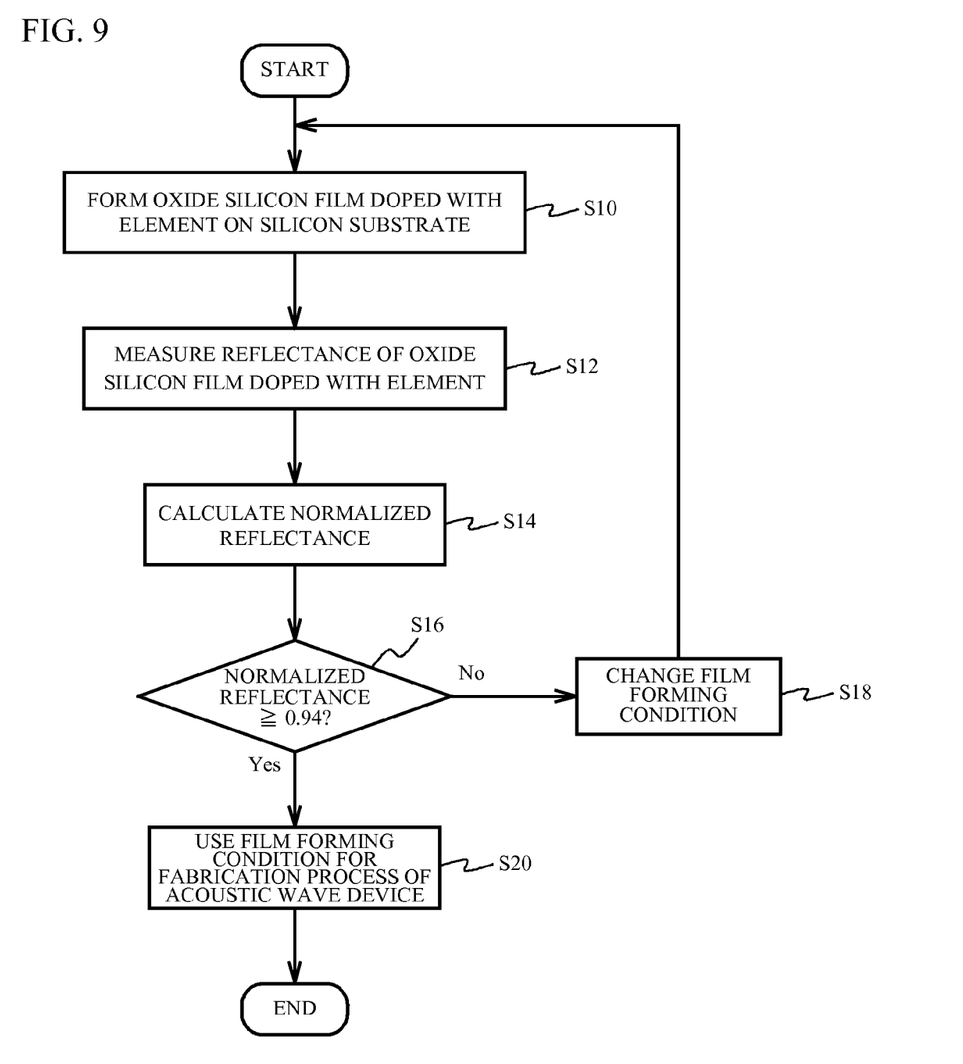
FIG. 9 is a flowchart illustrating a fabrication method of an acoustic wave device in accordance with a third embodiment.

Now, a description will be given of a fabrication method of an acoustic wave device based on this experiment result. FIG. 9 is a flowchart illustrating a fabrication method of an acoustic wave device in accordance with the third embodiment. Referring to FIG. 9, a doped oxide silicon film (e.g. an SiOF film) is formed on a silicon substrate by CVD (step S10). The film forming condition at this time is recorded in a database by storing a temperature, a pressure, a material gas, a flow rate of material gas, and a value of high-frequency output as a group. Multiple film forming conditions are recorded in the database. For example, film forming conditions are prioritized in order of the condition under which the film of which the normalized reflectance of the doped oxide silicon film is high is formed. Then, the film formation is conducted by sequentially reading out the film forming condition in order of priority from the database and setting it to the film formation apparatus.

Then, the spectroscopic film thickness meter is used to measure the film spectrum of the reflectance of the doped oxide silicon formed on the silicon substrate, and the local maximum value of the reflectance when the wavelength of the light is around 240 nm is obtained (step S12). In addition, the reflectance spectrum of the silicon substrate is also measured, and the reflectance of the silicon substrate at the wavelength in the local maximum value of the reflectance obtained in the step S12 is obtained. Then, calculated is a normalized reflectance obtained by normalizing the local maximum value of the reflectance of the doped oxide silicon film by the reflectance of the silicon substrate (step S14).

Next, it is determined whether the obtained normalized reflectance is equal to or larger than 0.94 (step S16). When the determination is No, the film forming condition is changed (step S18). After that, the flow goes back to the step S10. When the determination is Yes in the step S16, the film forming condition used in the step S10 is set to the film formation apparatus, and used in a fabrication process of the acoustic wave device (step S20).

Figure 10A:
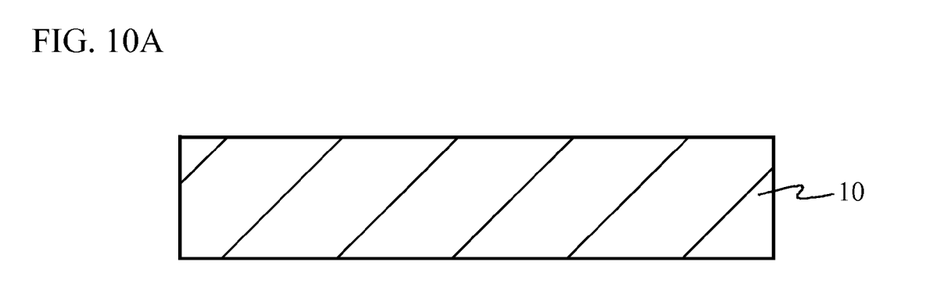
FIG. 10A through FIG. 10C are schematic cross-sectional views illustrating a fabrication process of the acoustic wave device.
Figure 10B:
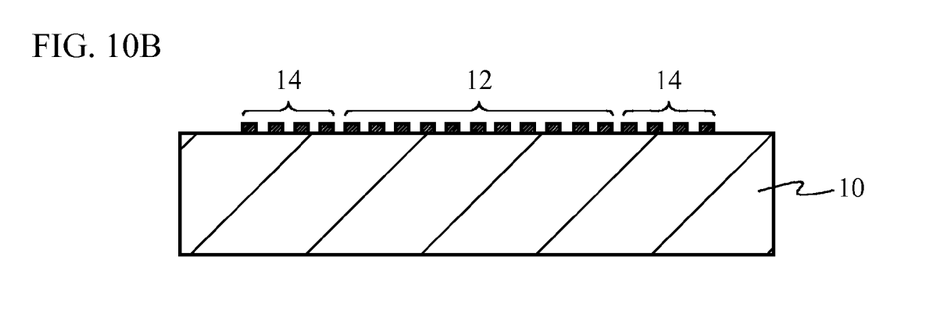
Figure 10C:
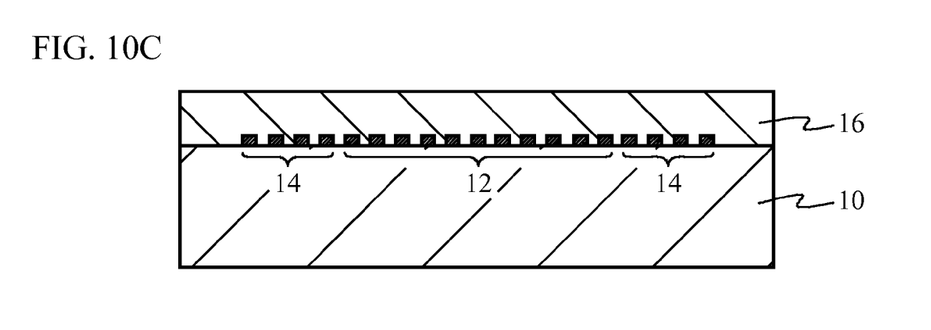

FIG. 10A through FIG. 10C are schematic cross-sectional views illustrating a fabrication process of the acoustic wave device. Referring to FIG. 10A, the piezoelectric substrate 10 made of an LT substrate or an LN substrate is prepared. Referring to FIG. 10B, the comb-shaped electrode 12 and the reflectors 14 made of metal are formed on the piezoelectric substrate 10 by the evaporation method and the liftoff technique for example. Referring to FIG. 10C, the doped oxide silicon film (e.g. the SiOF film 16) is formed on the piezoelectric substrate 10 by the CVD method so as to cover the comb-shaped electrode 12 and the reflectors 14. In the formation of the doped oxide silicon film, the film forming condition used in the step S10 of FIG. 9 is used.

According to the third embodiment, as described in the step S16 and the step S20 of FIG. 9, when the normalized reflectance of the doped oxide silicon film formed in the step S10 is equal to or larger than 0.94, the acoustic wave device is fabricated by using the film forming condition used in the step S10. Thus, it is possible to fabricate the acoustic wave device of which frequency temperature characteristics are improved and the propagation loss of the acoustic wave is reduced as described in FIG. 8, and to improve yield ratio.

The step S16 of FIG. 9 determines whether the normalized reflectance is equal to or larger than 0.94, but is not intended to suggest any limitation. It is more preferable to determine whether the normalized reflectance is equal to or larger than 0.95, and it is further preferable to determine whether the normalized reflectance is equal to or larger than 0.96. This enables to reduce the propagation loss of the acoustic wave more reliably.

Although the embodiments of the present invention have been described in detail, it should be understood that the various change, substitutions, and alterations could be made hereto without departing from the spirit and scope of the invention.

What is claimed is:

1. An acoustic wave device comprising:
   an electrode that is located on a substrate and excites an acoustic wave; and
   an oxide silicon film that is doped with an element and provided so as to cover the electrode, wherein
   a normalized reflectance of the oxide silicon film doped with the element is equal to or larger than 0.96, the normalized reflectance of the oxide silicon film doped with the element being obtained by normalizing a local maximum value of a reflectance when a light is caused to enter an upper surface of the oxide silicon film doped with the element by a reflectance when the light having a wavelength at the local maximum value is caused to enter an upper surface of the substrate directly.

2. The acoustic wave device according to claim 1, wherein the electrode is a comb-shaped electrode.

3. The acoustic wave device according to claim 1, wherein a wavelength of the light caused to enter the upper surface of the oxide silicon film doped with the element is within a range of 230 nm to 250 nm.

4. The acoustic wave device according to claim 1, wherein the oxide silicon film doped with the element is doped with more than one kind of element.

5. The acoustic wave device according to claim 1, wherein the oxide silicon film doped with the element is doped with fluorine.

6. The acoustic wave device according to claim 2, wherein a dielectric substance of which an acoustic velocity is faster than an acoustic velocity of the oxide silicon film doped with the element is located on the oxide silicon film doped with the element.

7. The acoustic wave device according to claim 2, wherein the piezoelectric substrate is an LT substrate or an LN substrate.

* * * * *